US012677463B2

(12) United States Patent
Lai et al.

(10) Patent No.: US 12,677,463 B2
(45) Date of Patent: Jul. 7, 2026

(54) HIGH ELECTRON MOBILITY TRANSISTOR WITH AN EXTENDED DRAIN FIELD PLATE

(71) Applicant: HiPer Semiconductor Inc., George Town (KY)

(72) Inventors: Yan Lai, Stockport (GB); Wei-Chen Yang, Zhubei City (TW)

(73) Assignee: HIPER SEMICONDUCTOR INC., George Town (KY)

( * ) Notice: Subject to any disclaimer, the term of this patent is extended or adjusted under 35 U.S.C. 154(b) by 379 days.

(21) Appl. No.: 18/502,710

(22) Filed: Nov. 6, 2023

(65) Prior Publication Data

US 2024/0405080 A1 Dec. 5, 2024

Related U.S. Application Data

(63) Continuation-in-part of application No. 18/327,396, filed on Jun. 1, 2023, now Pat. No. 11,848,376.

(51) Int. Cl.
  H10D 64/00 (2025.01)
  H10D 30/47 (2025.01)
  (Continued)

(52) U.S. Cl.
  CPC ......... H10D 64/112 (2025.01); H10D 30/475 (2025.01); H10D 62/8503 (2025.01); H10D 64/258 (2025.01)

(58) Field of Classification Search
  CPC ............... H10D 64/112; H10D 30/475; H10D 62/8503; H10D 64/258; H10D 64/251;
  (Continued)

(56) References Cited

U.S. PATENT DOCUMENTS

| 8,525,274 | B2 | 9/2013 | Takada | |
| 10,777,673 | B2 * | 9/2020 | Sheridan | .............. H10D 64/512 |

(Continued)

FOREIGN PATENT DOCUMENTS

| CN | 113823675 A | 12/2021 |
| TW | 201933490 A | 8/2019 |

OTHER PUBLICATIONS

H. Onodera, H. Hanawa and K. Horio ,"Analysis of Breakdown Characteristics in Gate and Source Field-Plate AlGaN/GaN HEMTS", NSTINanotech 2014, ISBN 978-14822-5827-1 vol. 2, Jan. 2014; pp. 499-502.

(Continued)

*Primary Examiner* — Tan N Tran
(74) *Attorney, Agent, or Firm* — MUNCY, GEISSLER, OLDS & LOWE, P.C.

(57) ABSTRACT

A high electron mobility transistor (HEMT) includes a GaN epi-layer, a first passivation layer, a source electrode metal, a drain electrode metal, a gate electrode metal, and a field plate. The first passivation layer is deposited on the GaN epi-layer. The source electrode metal, the drain electrode metal, and the gate electrode are recessed into the first passivation layer and deposited on the GaN epi-layer. The source electrode metal has a source field plate with a source field plate length Lsf. The drain electrode metal has a drain field plate with a drain field plate length Ldf, wherein Ldf>Lsf. The gate electrode is situated between the source electrode metal and the drain electrode metal. The field plate is situated between the gate electrode and the drain electrode metal.

15 Claims, 10 Drawing Sheets

(51) Int. Cl.
　　H10D 62/85　　　(2025.01)
　　H10D 64/23　　　(2025.01)
(58) Field of Classification Search
　　CPC .. H10D 64/111; H10D 62/343; H01L 23/3171
　　See application file for complete search history.

(56) References Cited

U.S. PATENT DOCUMENTS

| | | | |
|---|---|---|---|
| 11,799,000 B1 * | 10/2023 | Lai | H10D 30/47 |
| 11,848,376 B1 * | 12/2023 | Lai | H10D 62/824 |
| 2022/0328634 A1 * | 10/2022 | Bothe | H10D 64/111 |

OTHER PUBLICATIONS

Biyan Liao, Quanbin Zhou, Jian Qin and HongWang "Simulation of AlGaN/GaN HEMTs Breakdown Voltage Enhancement Using Gate Field-Plate, Source Field-Plate and Drain Field Plate", Electronics, Apr. 7, 2019, pp. 1-11.

Zhao Sheng-Lei, Chen Wei-Wei "Influence of a drain field plate on the forward Blocking characteristics of an AlGaN/GaN high electron mobility transistor", Chin. Phys. B vol. 22, No. 11;. Apr. 22, 2013; pp. 1-4.

* cited by examiner

HIGH ELECTRON MOBILITY TRANSISTOR WITH AN EXTENDED DRAIN FIELD PLATE

CROSS REFERENCE TO RELATED APPLICATIONS

This application is a Continuation-in-Part of co-pending application Ser. No. 18/327,396, filed on Jun. 1, 2023, for which priority is claimed under 35 U.S.C. § 120, the entire contents of all of which are hereby incorporated by reference.

BACKGROUND

1. Technical Field

The present disclosure is related to a high electron mobility transistor (HEMT), and specifically to a high electron mobility transistor with a feature that a length of a drain field plate is larger than a length of a source field plate.

2. Description of the Related Art

At least one metal field plate is commonly used in a power device, especially in a high electron mobility transistor (HEMT) device, to re-shape the electric field within the device. As a result, the peak electric field inside the device can be reduced, the breakdown voltage (BV) of the high electron mobility transistor can be increased, and the reliability of the high electron mobility transistor can consequently be improved. In a III-N material-based HEMT such as a GaN HEMT, a metal field plate is traditionally connected to the gate electrode or the source electrode, and the metal field plate either physically extends from the gate electrode metal or the source electrode metal or is electrically connected by vias in the device layout of the high electron mobility transistor.

Two conventional field plate designs are shown in FIG. 1A and FIG. 1B. As shown in FIG. 1A, at least one field plate 93 is situated between the gate electrode metal 94 and the drain electrode metal 92, with a field plate 93 electrically connected to the source electrode metal 91 or the gate electrode metal 94. In the prior art structure shown in FIG. 1A, the length of the source contact opening 91 (marked as Ls) and the length of drain contact opening 92 (marked as Ld) are usually the same; however, sometimes the relationship between the two can be Ld>Ls. The length of the source field plate 911 (marked as Lsf) and the length of the drain field plate 922 (marked as Ldf) in the relation of Lsf/Ls (or Ldf/Ld) is usually very small (for example, 0.2 um Lsf compared to 2 um Ls), and this relation is usually defined by lithography to allow a certain degree of misalignment between the source/drain metal and source/drain opening such that Lsf=Ldf. As shown in FIG. 1B, a field plate 911*a* extends from the source electrode metal 91*a* and over the entire gate electrode metal 94*a* such that Lsf>Ldf. It is noted that Ldf is usually very small (i.e., 0.2 um) and is usually defined by lithography to allow a certain degree of misalignment between the drain metal 922*a* and drain opening 92*a*. It is noted that both the gate electrode structure 95 and 95*a* shown in FIG. 1A and FIG. 1B are a p-type GaN gate structure for an enhancement GaN HEMT device.

SUMMARY

It is an object of the present invention to provide a high electron mobility transistor with a feature that a length of a drain field plate is larger than a length of a source field plate.

To achieve the above objective, the present disclosure provides a high electron mobility transistor (HEMT) comprising a GaN epi-layer, a first passivation layer, a source electrode metal, a drain electrode metal, a gate electrode metal, and a field plate. The first passivation layer is deposited on the GaN epi-layer. The source electrode metal, the drain electrode metal, and the gate electrode are recessed into the first passivation layer and deposited on the GaN epi-layer. The source electrode metal has a source field plate with a source field plate length (Lsf). The drain electrode metal has a drain field plate with a drain field plate length (Ldf), wherein Ldf>Lsf. The gate electrode metal is situated between the source electrode metal and the drain electrode metal. The field plate is situated between the gate electrode metal and the drain electrode metal.

The present disclosure provides a high electron mobility transistor (HEMT) with multiple metal field plate designs connected to the drain electrode metal. When the HEMT is applied together with the gate electrode metal and/or the source field plate, the breakdown voltage of the HEMT of the present disclosure can be increased and electric field is more uniformly distributed within the same, and then the reliability of the high electron mobility transistor of the present disclosure is consequently improved. It is noted that although the structures in various embodiments of the present disclosure are based on an enhancement mode GaN HEMT with a p-type GaN gate structure, the field plate designs shown in the present disclosure are also applicable to a depletion mode GaN HEMT as well as other III-N material-based HEMTs.

DETAILED DESCRIPTION OF THE EMBODIMENTS

In order to make the structure and characteristics as well as the effectiveness of the present disclosure further understood and recognized, a detailed description of the present disclosure is provided as follows, along with embodiments and accompanying figures.

Figure 1A:
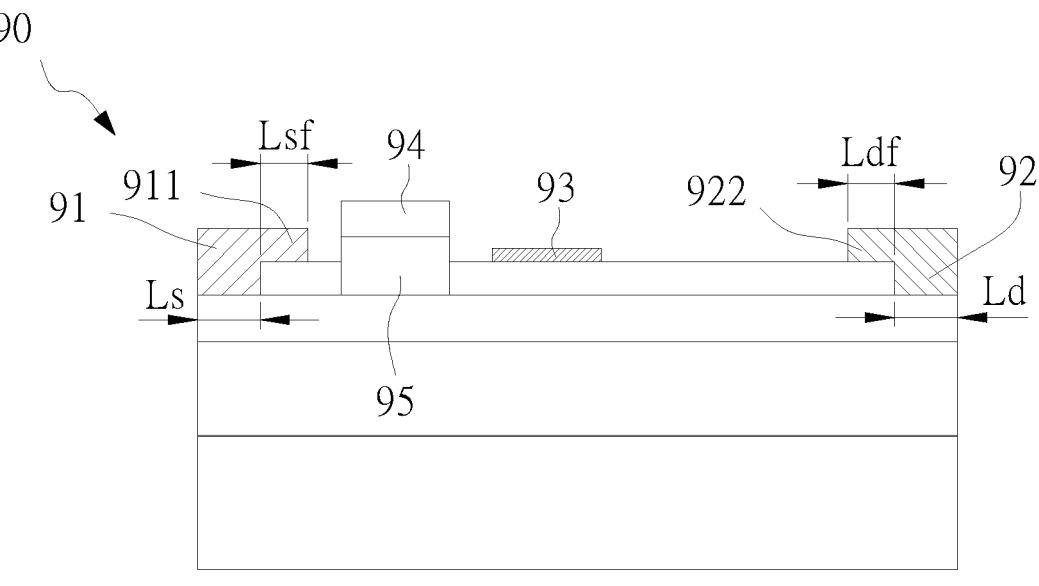
FIG. 1A illustrates a schematic diagram of a section view of a first embodiment of a high electron mobility transistor of the prior art.
Figure 1B:
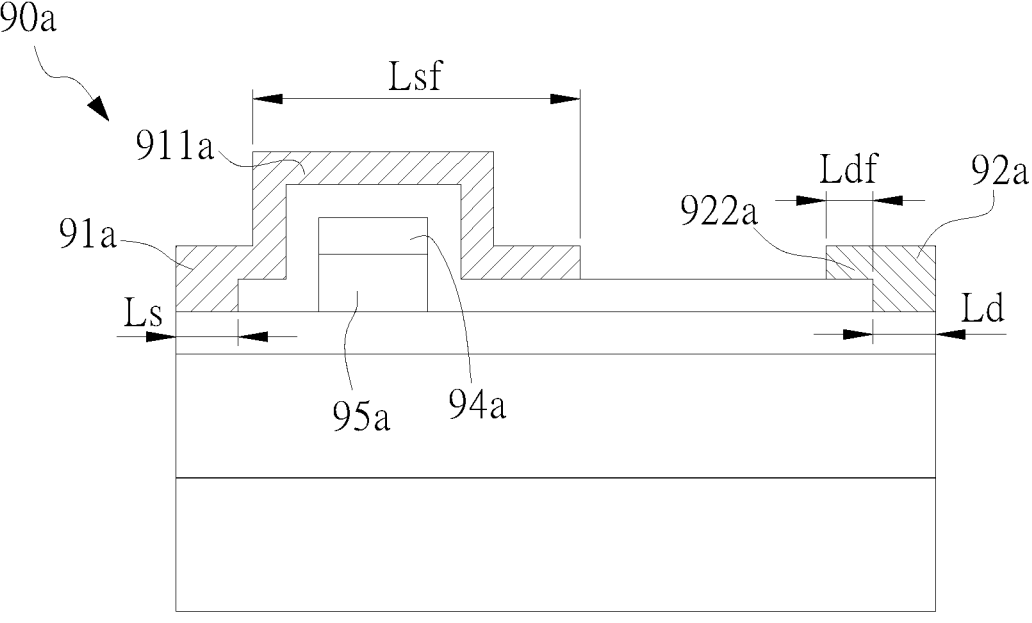
FIG. 1B illustrates a schematic diagram of a section view of a second embodiment of a high electron mobility transistor of the prior art.
Figure 2:
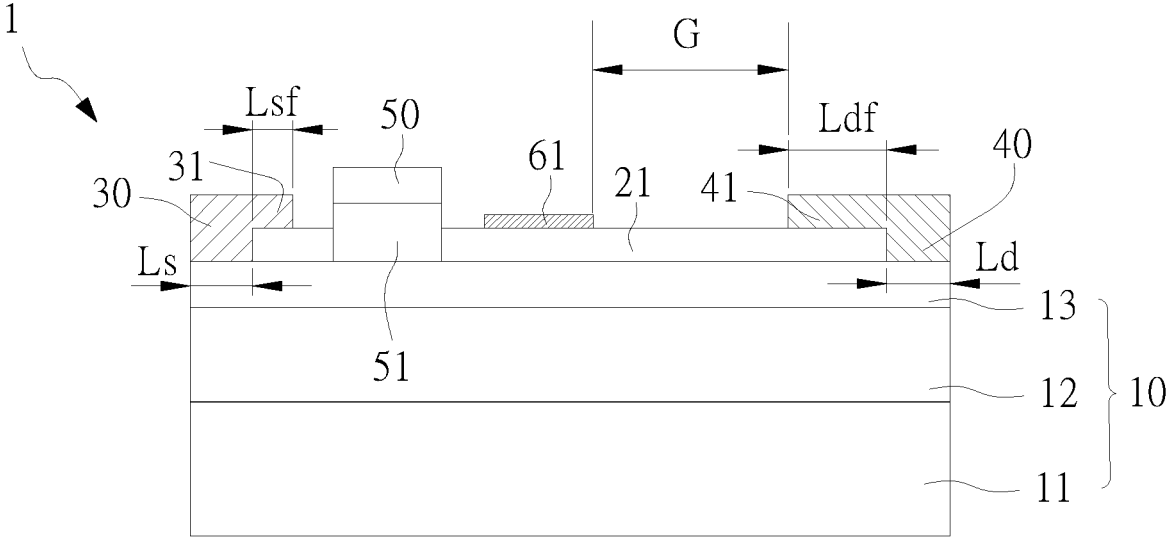
FIG. 2 illustrates a schematic diagram of a section view of a first embodiment of a high electron mobility transistor of the present disclosure.

Please refer to FIG. 2, which presents schematic diagrams of a section view of a first embodiment of the present disclosure.

As shown in FIG. 2, the first embodiment of a high electron mobility transistor 1 (HEMT) has a GaN epi-layer 10, a first passivation layer 21, a source electrode metal 30, a drain electrode metal 40, a gate electrode metal 50, a gate electrode structure 51, and a field plate 61. The GaN epi-layer 10 includes a substrate 11, a GaN buffer layer 12, and a barrier layer 13. The substrate 11 can be a silicon layer, a sapphire layer, a SiC layer or a layer made of other more complex materials such as SOI or QST. The GaN buffer 12 can be made of either graded $Al_xGa_{1-x}N$ layers or AlN/GaN super lattice layers, with a GaN layer on the top. The barrier layer 13 is made of $Al_yGa_{1-y}N$. The first passivation layer 21 is made of SiN or a combination of SiN and $SiO_2$ and is disposed on the GaN epi-layer 10. It is noted that the first passivation layer 21 can also be a combination of a thin transition layer of AlN or $Al_2O_3$ on top of the GaN epi-layer 10 and a dielectric layer; i.e., the thin transition layer of AlN or $Al_2O_3$ is on the top of the GaN epi-layer 10 and the main dielectric layer is deposited on the thin transition layer.

As shown in FIG. 2, the source electrode metal 30, the drain electrode metal 40, and the gate electrode metal 50 are recessed into the first passivation layer 21 and deposited on the GaN epi-layer 10. The source electrode metal 30 has a source field plate 31 with a source field plate length marked as Lsf. In this embodiment, the source field plate 31 is an extension portion of the source electrode metal 30. As shown in FIG. 2, the drain electrode metal 40 has a drain field plate 41 with a drain field plate length marked as Ldf. In this embodiment, the drain field plate 41 is an extension portion of the drain electrode metal 40. In order to optimize the breakdown voltage (BV) of the high electron mobility transistor 1, the drain field plate length (Ldf) is larger than the source field plate length (Lsf); i.e., Ldf>Lsf. The gate electrode metal 50 is situated on the gate electrode structure 51 and between the source electrode metal 30 and the drain electrode metal 40. In the first embodiment, the field plate 61 is a metal field plate and can be electrically connected to the source electrode metal 30 or to the gate electrode metal 50 and is deposited on the first passivation layer 21. The field plate 61 is situated between the gate electrode metal 50 and the drain electrode metal 40.

It is noted that, in order to maintain the on-resistance optimisation of the high electron mobility transistor 1, a distance between the gate electrode metal 50 and the source electrode metal 30 needs to be kept as small as possible; i.e., Lsf usually needs to be kept at the minimum value allowed by manufacturing requirements. As shown in FIG. 2, because the drain field plate 41 is the portion of the drain electrode metal 40 extended toward the gate electrode metal 50, the drain field plate length (Ldf) is equal to a length of the extended portion of the drain electrode metal 40 in this embodiment. However, if the drain field plate 41 extends too far, the drain field plate 41 becomes too close to the field plate 61 placed between the gate electrode metal 50 and the drain electrode metal 40. In such a case, the breakdown voltage of the high electron mobility transistor 1 will begin to decrease. Thus, a gap (marked as G in FIG. 2) between the field plate 61 and the drain field plate 41 should be equal to or larger than 0.5 um. It is noted that, although the high electron mobility transistor 1 of the present disclosure is an enhancement-mode (E-mode) high electron mobility transistor; i.e. the gate electrode structure 51 is a p-type GaN gate structure, designs and various embodiments of the drain field plate 41 and the field plate 61 presented in the rest of the present disclosure are also applicable to a depletion mode GaN HEMT as well as other III-N material-based HEMTs.

It is noted that for forming a higher voltage device, an additional passivation layer made of SiN or $SiO_2$ or a combination of both can be deposited to cover the first passivation layer 21, the source electrode metal 30, the drain electrode metal 40, the drain field plate 41, the gate electrode metal 50, and the field plate 61 of the high electron mobility transistor 1. Therefore, an additional metal field plate electrically connected to the source electrode metal 30 or gate electrode metal 50 can be deposited on the additional passivation layer described above afterwards. It is noted that a portion of the additional field plate has to be overlapping with the field plate 61 and the additional field plate has to be kept at a minimum distance of 0.5 um from the drain field plate 41. It is noted that another additional passivation layer made of SiN or $SiO_2$ or a combination of both can be deposited to cover the additional passivation layer described above; and another additional field plate can also be added on the additional passivation layer described above afterwards for device with even higher voltage rating.

Figure 3:
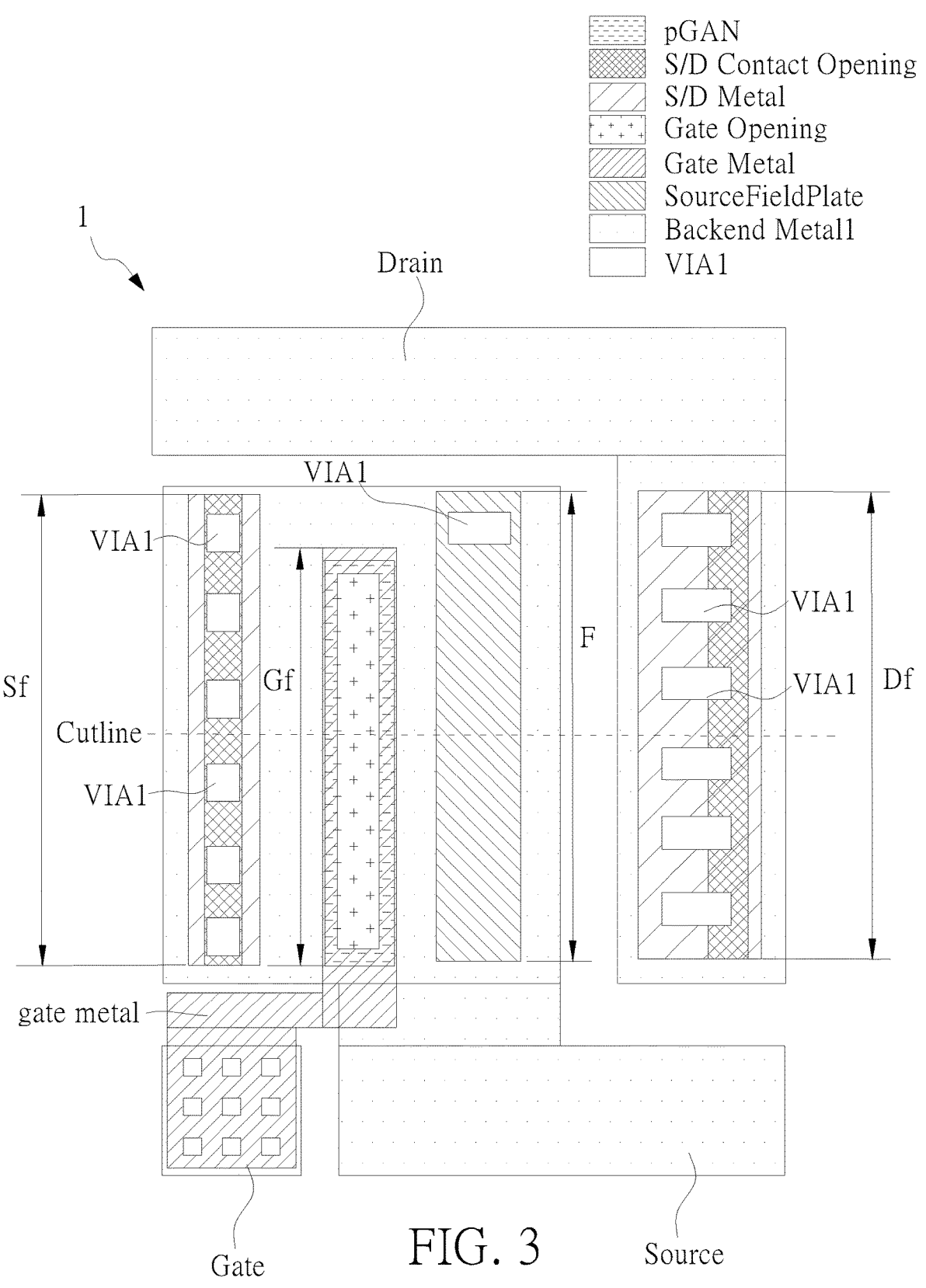
FIG. 3 is a top view of a layout of the first embodiment of a high electron mobility transistor of the present disclosure.
Figure 4A:
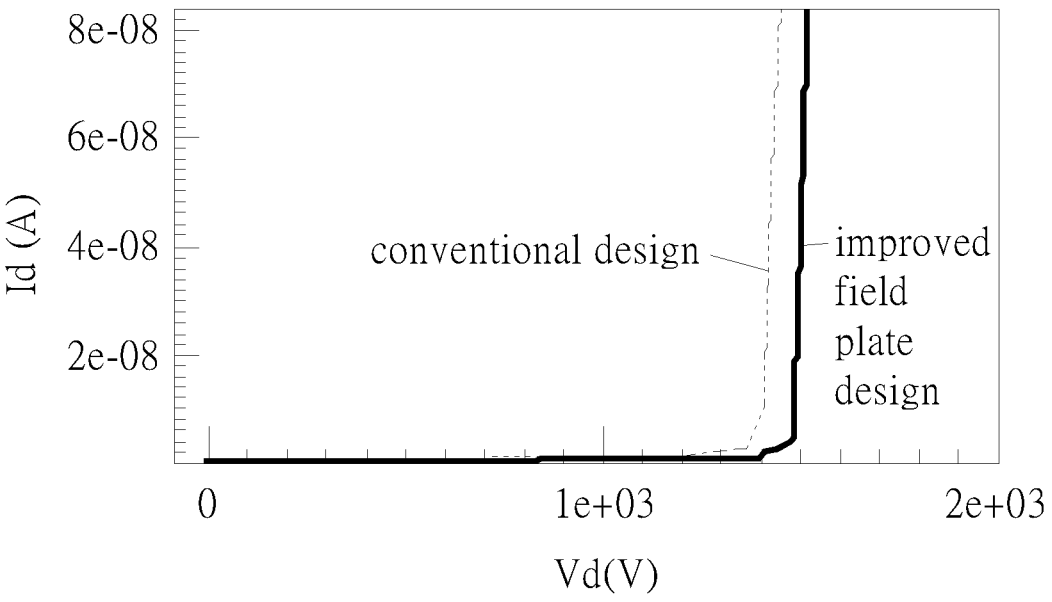
FIG. 4A illustrates a simulated drain leakage behavior (Id vs. Vd) showing a comparison between the prior art and the high voltage device embodiment of the present disclosure.
Figure 4B:
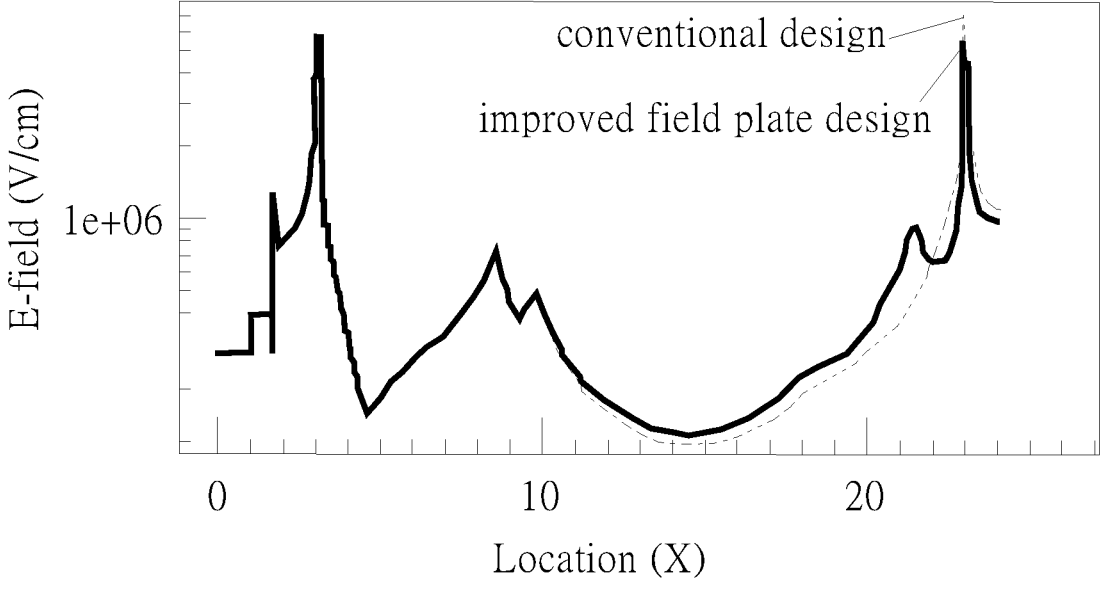
FIG. 4B illustrates the behavior of a simulated electric field along the device channel showing a comparison between the prior art and the high voltage device embodiment of the present disclosure biased with 600V at the drain.

Please refer to FIG. 3, FIG. 4A and FIG. 4B, which present a top view of a layout of the first embodiment of the high electron mobility transistor, the simulated drain leakage behavior (Id vs. Vd) showing a comparison between the prior art and the second embodiment of the present disclosure, and the behavior of a simulated electric field along the device channel showing a comparison between the prior art and the second embodiment of the present disclosure biased with 600V at the drain.

As shown in FIG. 3, the source electrode, drain electrode and gate electrode are electrically connected to the underlying layers by VIA1 in the top view of a layout of the first embodiment of a high electron mobility transistor 1. The source field plate is electrically connected to the metal layer that extends from the source electrode by VIA1. The cutline gives the cross section shown in FIG. 2; i.e., only one layer of field plate is presented and do not show the electrical connections between the field plate 61 and the source electrode 30 or the gate electrode 50. In the first embodiment of the present disclosure, the field plate 61 is electrically connected to the source electrode 30. However, the present disclosure is not limited to the above-mentioned embodiment; the field plate 61 can also be electrically connected to the gate electrode 50. According to the layout shown in FIG. 3, the drain metal on the drain opening are extended toward the field plate and gate electrode such that they form the drain field plate 41 explained in FIG. 2. It is noted that, according to FIG. 3, the source finger (marked as Sf), the gate finger (marked as Gf) and the drain finger (marked as Df) are normally drawn with the same length and the previously mentioned length is shorter than the length of the field plate between the gate and the drain electrode (marked as F).

The simulated drain leakage of the conventional design is compared with that of the high voltage device embodiment; i.e., having two field plates and extended drain metal (the drain field plate 41) of the present disclosure in FIG. 4A. The conventional design is simulated with Lsf=Ldf. The second embodiment with extended drain metal (the drain field plate 41) of the present disclosure is simulated with Ldf=Lsf+1.3 um. Apart from the difference in length between the second embodiment of the present disclosure and the conventional design, all the other dimensions of the two devices are the same. Two field plates are used in the simulation for high voltage devices and are electrically connected to the source. According to the simulated drain leakage results shown in FIG. 4A, an improvement is apparent in the high electron mobility transistor of the second embodiment of the present disclosure.

The simulated electric field along the device channel of the conventional design and that of the high voltage device embodiment i.e., having two field plates and extended drain metal (the drain field plate 41) of the present disclosure is shown in FIG. 4B. Both the conventional design and the second embodiment of the present disclosure are biased with 600V at the drain. The X axis is the distance from the source along the channel, with the source electrode being 0 and the drain electrode being the furthest point along the channel. The second embodiment of the present disclosure reduces the electric field at the drain electrode by more than 20% compared with the conventional design.

Figure 5:
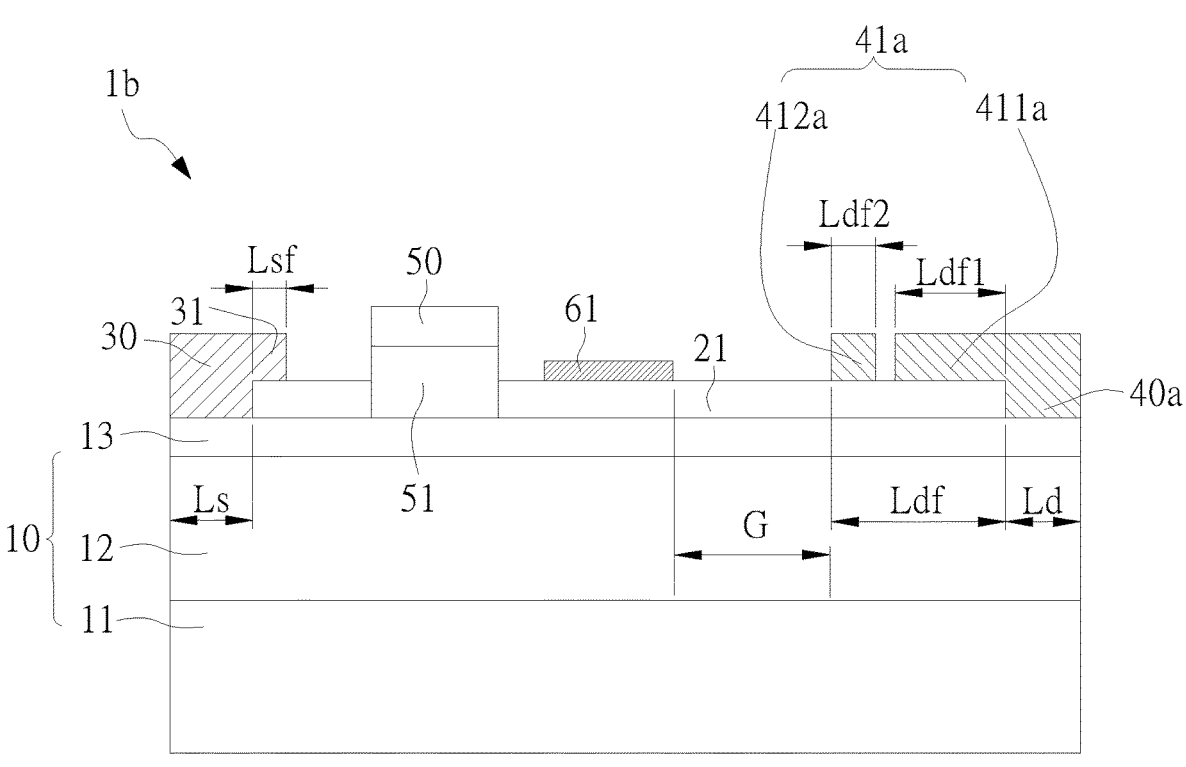
FIG. 5 illustrates a schematic diagram of a section view of a second embodiment of a high electron mobility transistor of the present disclosure.
Figure 6:
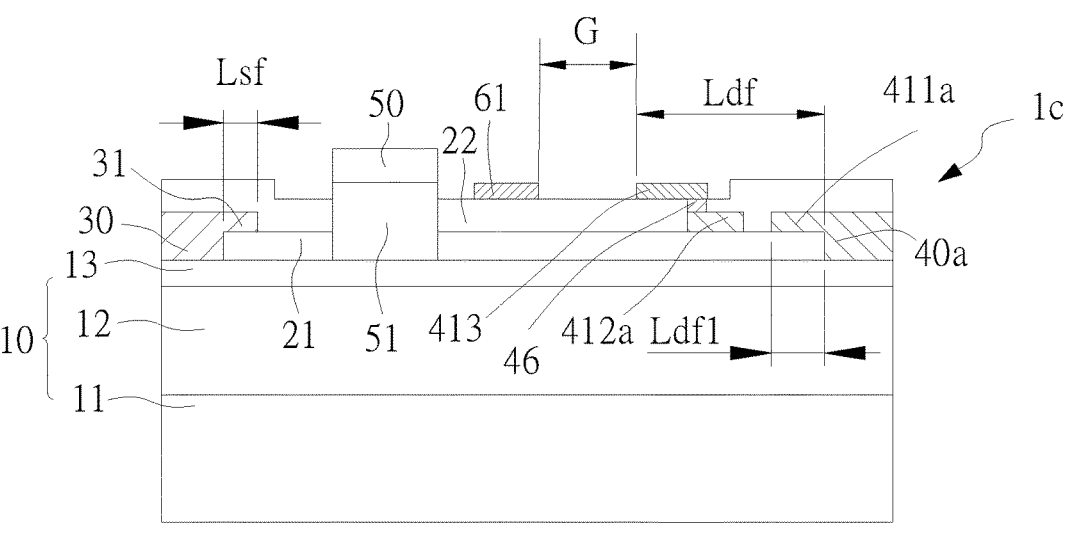
FIG. 6 illustrates a schematic diagram of a section view of a third embodiment of a high electron mobility transistor of the present disclosure.

Please refer to FIG. 5 and FIG. 6, which present schematic diagrams of a section view of a second embodiment and a third embodiment of a high electron mobility transistor of the present disclosure.

As shown in FIG. 5, in the second embodiment, the drain field plate 41a of the high electron mobility transistor 1b is divided into a first drain extension section 411a and a second extension section 412a. The field plate 61, the first drain extension section 411a, and the second extension section 412a are deposited on the first passivation layer 21. The first drain extension section 411a and the second extension section 412a are spaced apart, and the second extension section 412a is situated between the field plate 61 and the first drain extension section 411a. The drain field plate length (Ldf) in this embodiment refers to Ldf=Ldf1+Ldf2+a length of the gap between the first drain extension section 411a and the second extension section 412a and Ldf>Lsf and $L_{df1} \geq L_{sf}$. In this embodiment, the first drain extension section 411a is the extension portion of the drain electrode metal 40a. The second drain extension section 412a is electrically connected to the drain electrode metal 40a by vias in the device layout. The section of the second extension section 412a which is closer to the gate electrode metal 50 can be made of the same metals as used in the drain electrode metal 40a, or the same metal as used in the field plate 61. The field plate 61 is electrically connected to the source electrode metal 30 or gate electrode metal 50 and kept at a minimum distance (G) of 0.5 um from the second extension section 412a.

As shown in FIG. 6, in the third embodiment, the high electron mobility transistor 1c further includes a second passivation layer 22 and a first additional drain field plate 413. The second passivation layer 22 covers the first passivation layer 21, the source electrode metal 30, a first drain extension section 411a, a second extension section 412a, and the drain electrode metal 40a. The first drain extension section 411a is the extension portion of the drain electrode metal 40a. The first drain extension section 411a and the second extension section 412a are spaced apart. The first drain extension section 411a and the second extension section 412a are situated on the first passivation layer 21; i.e., both of them can be deposited at the same time. Both the field plate 61 and the first additional drain field plate 413 are situated on the second passivation layer 22; i.e., both of them can be deposited at the same time. A portion of the first additional drain field plate 413 is overlapping with the second extension section 412a. The first additional drain field plate 413 is electrically connected to the second extension section 412a by VIA1 46. Both the first additional drain field plate 413 and the second drain extension section 412a are electrically connected to the drain electrode metal 40a by vias in the device layout. The length relationship between the drain field plate length (Ldf) and the source field plate length (Lsf) in this embodiment refers to Ldf>Lsf and Ldf1≥Lsf. The field plate 61 keeps at a minimum distance (G) of 0.5 um from the first additional drain field plate 413.

For forming a high voltage device for the high electron mobility transistor 1c, an additional passivation layer can be provided to cover the second passivation layer 22, the field plate 61, and the first additional drain field plate 413 of the high electron mobility transistor 1c. Then an additional field plate and an additional drain field plate can be deposited on the additional passivation layer described above. It is noted that a portion of the additional field plate has to be overlapping with the field plate 61 and a portion of the additional drain field plate has to be overlapping with the first additional drain field plate 413. The additional field plate overlapping with the field plate 61 keeps at a minimum distance (G) of 0.5 um from the additional drain field plate overlapping with the first additional drain field plate 413.

Figure 7A:
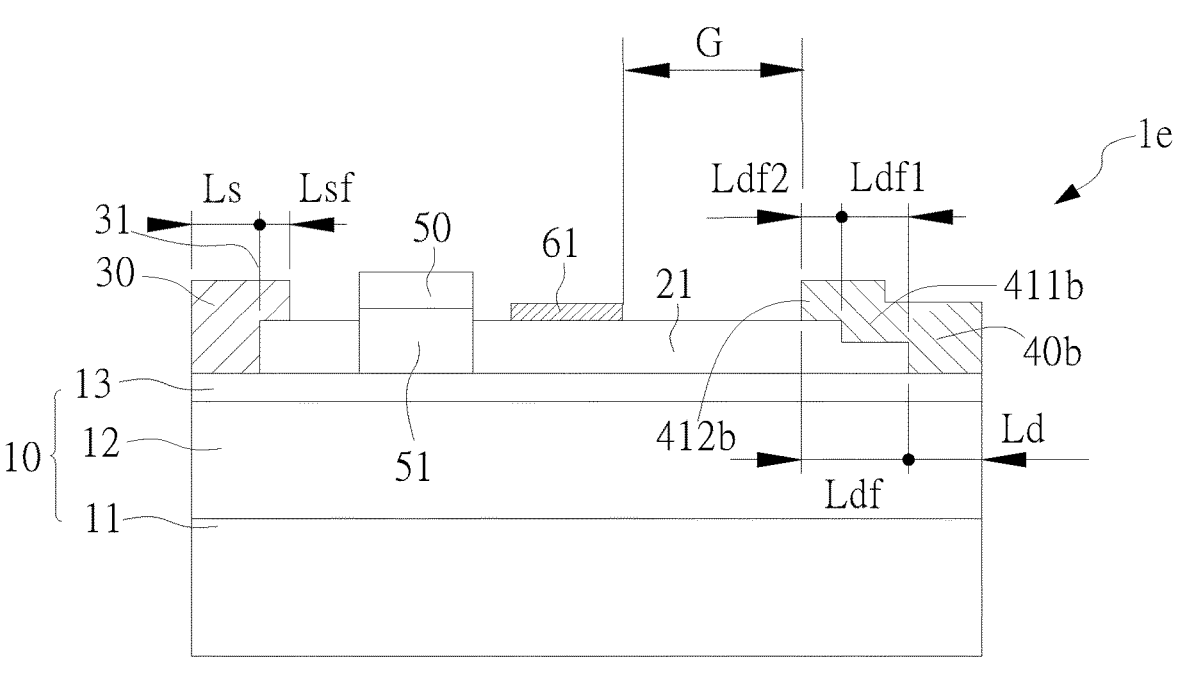
FIG. 7A illustrates a schematic diagram of a section view of a fourth embodiment of a high electron mobility transistor of the present disclosure.
Figure 7B:
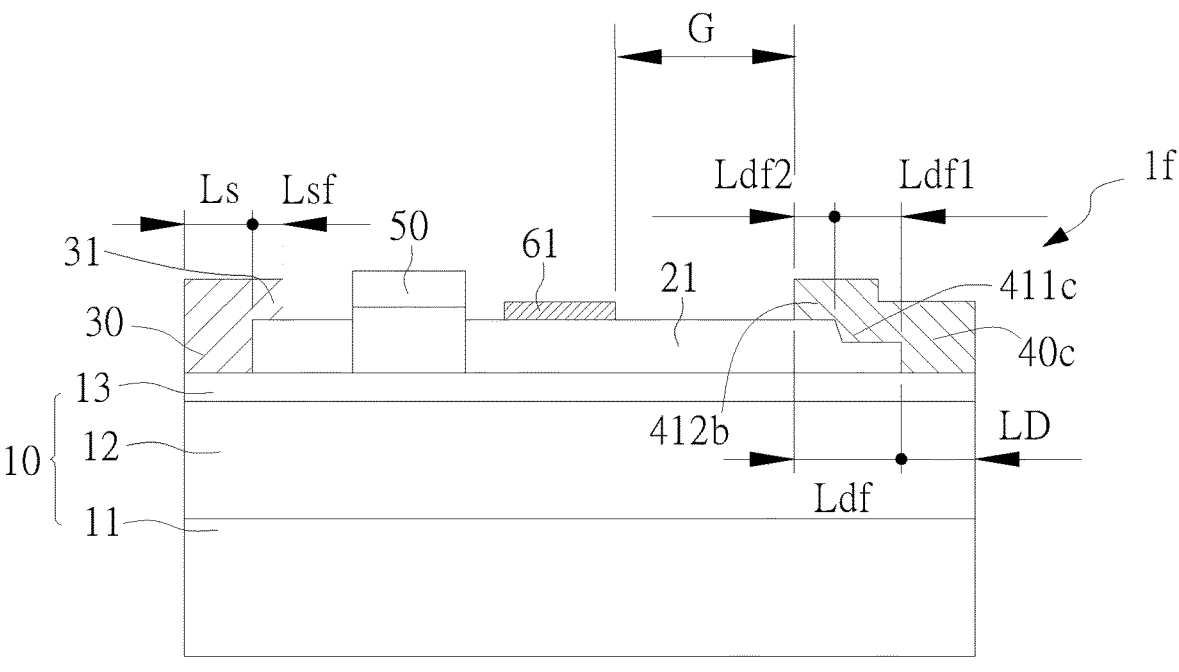
FIG. 7B illustrates a schematic diagram of a section view of a fifth embodiment of a high electron mobility transistor of the present disclosure.

Please refer to FIG. 7A and FIG. 7B, which present schematic diagrams of a section view of a fourth and a fifth embodiment of a high electron mobility transistor of the present disclosure.

As shown in FIG. 7A, in the fourth embodiment, the drain field plate 41b of the high electron mobility transistor 1e includes a first drain extension section 411b and a second extension section 412b. The first passivation layer 21 under the first drain extension section 411b is recessed and the fist passivation layer 21 under the second drain extension section 412*b* remains full thickness; i.e., the first passivation layer 21 under the first drain extension section 411*b* and the first passivation layer 21 under the second extension section 412*b* form a stepped shape. The two opposite sides of the first drain extension section 411*b* are connected with the drain electrode metal 40*b* and the second extension section 412*b* respectively. According to one embodiment of the present disclosure, a thin etch stop layer such as AlN can be grown within the first passivation layer 21 and recession of the etching to the first passivation layer 21 can be stopped when the thin etch stop layer is reached. The length relationship of the drain field plate length (Ldf) in this embodiment refers to Ldf=Ldf1+Ldf2 and Ldf>Lsf. The field plate 61 keeps at a minimum distance (G) of 0.5 um from the second extension section 412*b*.

It is noted that, the first passivation layer 21 under the first drain extension section 411*b* and the first passivation layer 21 under the second extension section 412*b* are not limited with the embodiment for forming a vertically stepped shape. In fact, as shown in FIG. 7B, the first passivation layer 21 under the first drain extension section 411*b* and the first passivation layer 21 under the second extension section 412*b* of the high electron mobility transistor If can be formed with a tapered profile, as well. Thus, for the tapered profile embodiment (shown in FIG. 7B), the first passivation layer 21 under the first drain extension section 411*b* is etched with a slope for allowing the bottom of the first drain extension section 411*b* to be narrower than the top of the first drain extension section 411*b* to reduce the electric field at the corner of the first passivation layer 21.

Figure 8A:
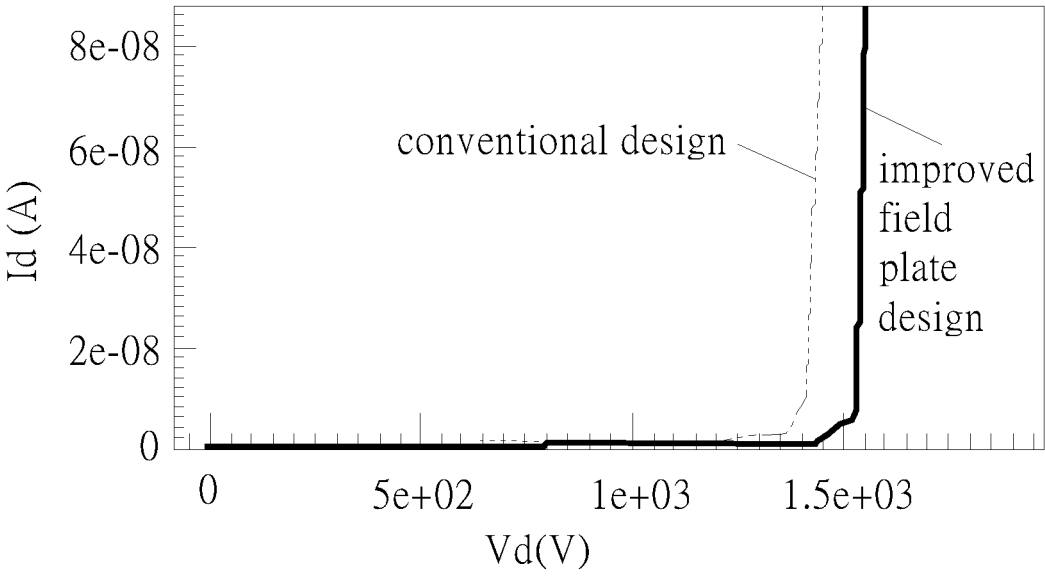
FIG. 8A illustrates a simulated drain leakage behavior (Id vs. Vd) showing a comparison between the prior art with two source field plates and the embodiment of the present disclosure with the feature of Ldf=Ldf1+Ldf2=Lsf+1.3 um.
Figure 8B:
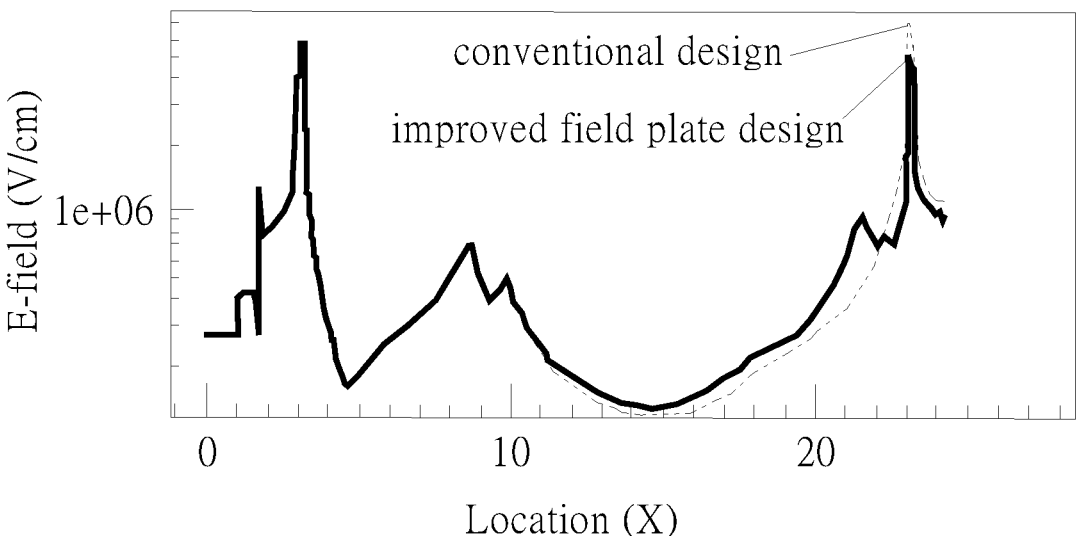
FIG. 8B illustrates the behavior of a simulated electric field along the device channel showing a comparison between the prior art and the embodiment of the present disclosure with extended drain metal, biased with 600V at the drain.

Please refer to FIG. 8A and FIG. 8B, which present the simulated drain leakage behaviors (Id vs. Vd) for comparison of the prior art with two source field plates and the current embodiments of the present disclosure with the feature of Ldf=Ldf1+Ldf2=Lsf+1.3 um, and the behavior of a simulated electric field along the device channel showing a comparison between the first embodiment of the prior art and the current embodiments of the present disclosure with extended drain metal biased with 600V at the drain.

As shown in FIG. 8A, the improved field plate design of the present disclosure is simulated with Ldf=Ldf1+Ldf2=Lsf+1.3 um; the conventional design is simulated with Lsf=Ldf. Apart from the drain field plate length difference between the present disclosure and the conventional design, all the other dimensions of the two are the same. Two field plates are used in the simulation of high voltage devices for the both conventional design and the present disclosure, and are electrically connected to the source electrode.

As shown in FIG. 8B, a simulated electric field along the device channel of the conventional design is compared with that of the improved design with extended drain metal of the present disclosure. The device is biased with 600V at the drain. The X axis is the distance from the source along the channel, with the source electrode being 0 and drain electrode being the furthest point along the channel. The improved field plate design of the present disclosure reduces the electric field at the drain electrode by more than 25% compared with the conventional design.

Figure 9:
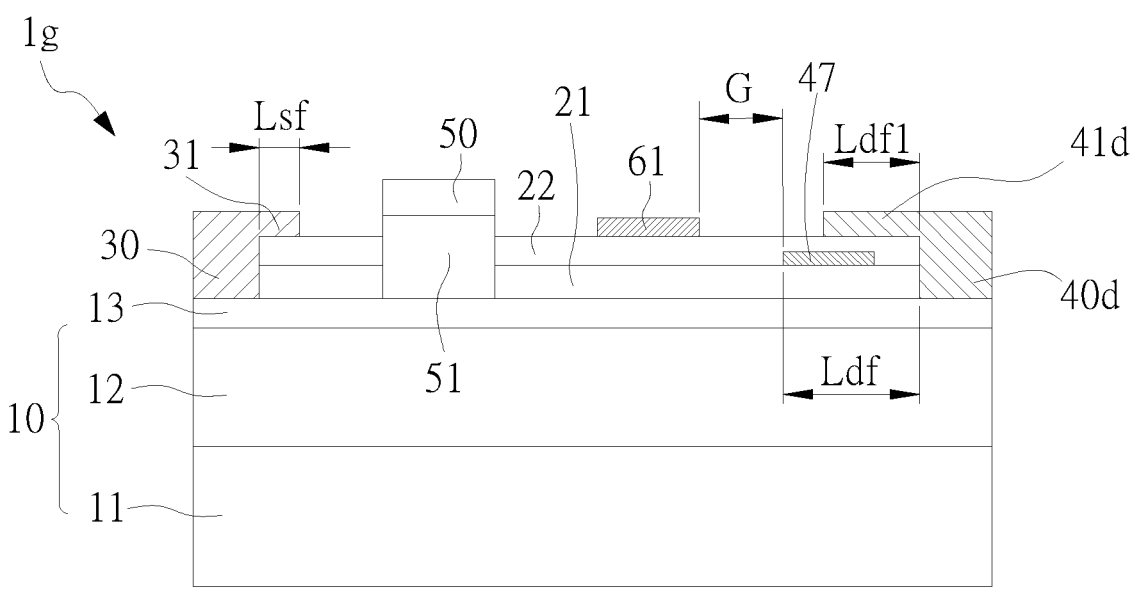
FIG. 9 illustrates a schematic diagram of a section view of a sixth embodiment of a high electron mobility transistor of the present disclosure.

Please refer to FIG. 9, which present schematic diagrams of a section view of a sixth embodiment of a high electron mobility transistor of the present disclosure.

As shown in FIG. 9, in the sixth embodiment, the high electron mobility transistor 1*g* includes a floating field plate 47. The floating field plate 47 is deposited on the first passivation layer 21. The source field plate 31, the field plate 61 and the drain field plate 41*d* are deposited on the second passivation layer 22, wherein the second passivation layer 22 is sandwiched between the floating field plate 47 and the drain field plate 41*d*. A portion of the floating field plate 47 is overlapping with the drain field plate 41*d*. The length relationship in this embodiment is Ldf>Ldf1, Ldf>Lsf, Ldf1>Lsf. Both the drain field plate 41*d* and the floating field plate 47 need to be kept a minimum distance of 0.5 um from the field plate 61. It is noted that the floating field plate 47 refers to a field plate not electrically connected to either the source electrode metal 30, the gate electrode metal 50 or the drain electrode metal 40. The present disclosure is not limited to the above-mentioned embodiment. However, an additional field plate can be placed on the first passivation 21. A portion of the additional field plate that is closer to the drain electrode and is overlapping with the field plate 61.

Figure 10:
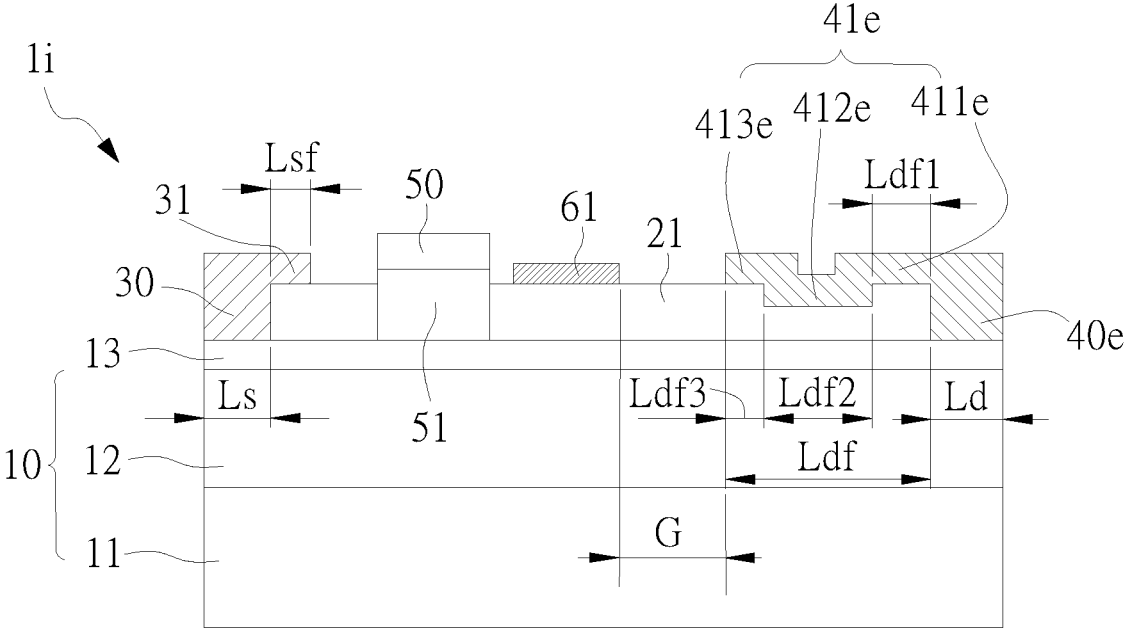
FIG. 10 illustrates a schematic diagram of a section view of a seventh embodiment of a high electron mobility transistor of the present disclosure.

Please refer to FIG. 10, which present schematic diagrams of a section of a seventh embodiment of a high electron mobility transistor of the present disclosure.

As shown in FIG. 10, in the seventh embodiment, i.e., the high electron mobility transistor 1*i*, the drain field plate 41*e* is divided into a first drain extension section 411*e*, a second extension section 412*e*, and a third drain extension section 413*e*. The first passivation layer 21 under the second extension section 412*e* is recessed. The first passivation layer 21 under the first drain extension section 411*e* and the third drain extension section 413*e* remains full thickness. Two opposite sides of the second extension section 412*e* are connected with the first drain extension section 411*e* and the third drain extension section 413*e* respectively. According to one embodiment of the present disclosure, a thin etch stop layer such as AlN can be grown within the first passivation layer 21 and the recession of the etching to the first passivation layer 21 for the second extension section 412*e* can be stopped when the thin etch stop layer is reached. The drain field plate length in this embodiment refers to Ldf=Ldf1+Ldf2+Ldf3 and Ldf>Lsf. It is noted that, although the first passivation layer 21 under the second extension section 412*e* is etched, the present disclosure is not limited to this embodiment. In fact, the first passivation layer 21 being etched under one of the first drain extension section 411*e*, the second extension section 412*e*, and the third drain extension section 413*e* is sufficient for the present disclosure. When both 411*e* and 412*e* are recessed into passivation layer 21, then this embodiment becomes the same as embodiment fourth.

It is noted that, the first passivation layer 21 under the second extension section 412*e* is not limited with the embodiment to a vertically stepped shape. In fact, similar to the tapered profile embodiment shown in FIG. 7B, the first passivation layer 21 can etched with a slope and form with a tapered profile such that a bottom of the second extension section 412*e* is narrower than the top of the second extension section 412*e* to reduce the electric field at the corner of the first passivation layer 21.

Figure 11:
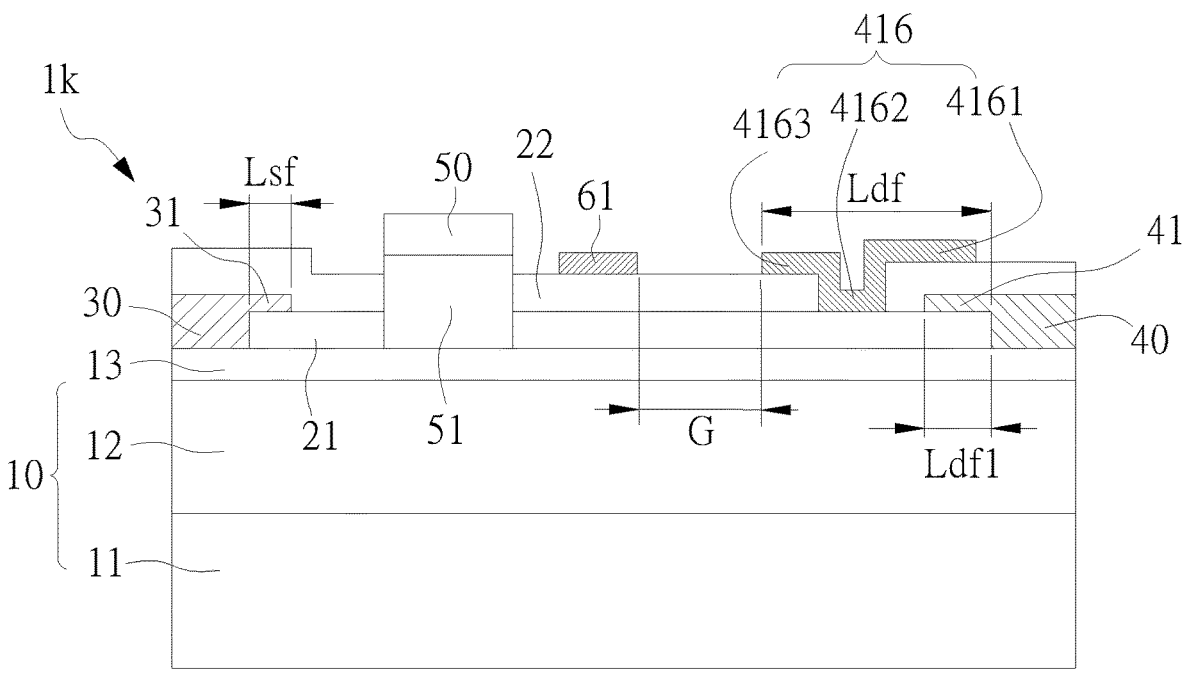
FIG. 11 illustrates a schematic diagram of a section view of an eighth embodiment of a high electron mobility transistor of the present disclosure.
Figure 12:
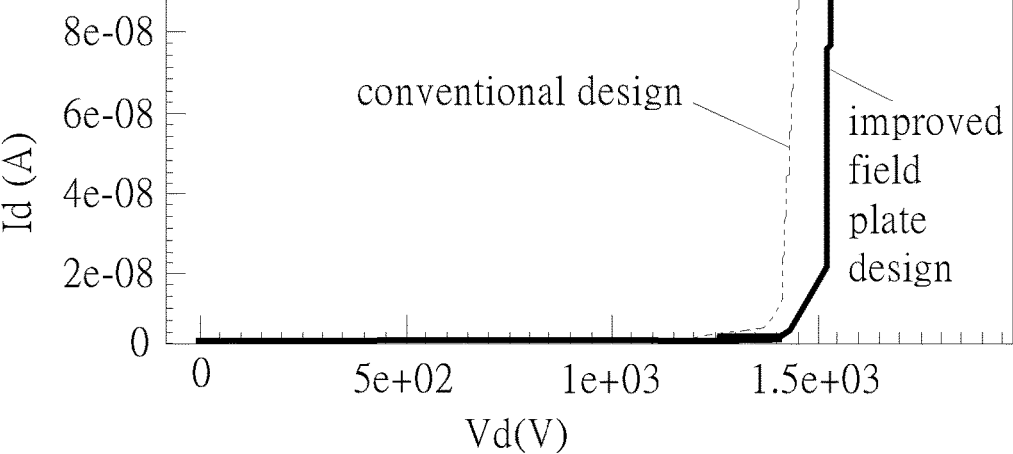
FIG. 12 illustrates a simulated drain leakage behavior (Id vs. Vd) showing a comparison between the first embodiment of the prior art and the eighth embodiment of the present disclosure.

Please refer to FIG. 11 and FIG. 12, which present schematic diagrams of an eighth embodiment of the present disclosure and simulated drain leakage behavior (Id vs. Vd) showing a comparison between the prior art and the eighth embodiment of the present disclosure.

As shown in FIG. 11, the high electron mobility transistor 1*k* further includes a second passivation layer 22 and a second additional drain field plate 416. The drain field plate 41 is deposited on the first passivation layer 21. The field plate 61 is deposited on the second passivation layer 22. The second additional drain field plate 416 is deposited on the second passivation layer 22 and a portion of the second additional drain field plate 416 is overlapping with the drain field plate 41. In this embodiment, the second additional drain field plate 416 is divided into a first section 4161, a second section 4162, and a third section 4163. Both the first section 4161 and the third section 4163 are deposited on the second passivation layer 22. The second passivation layer 22 under the second section 4162 is recessed such that the second section 4162 is deposited on the first passivation layer 21. Two opposite sides of the second section 4162 are connected with the first section 4161 and the third section 4163 respectively. The second passivation layer 22 covers the first passivation layer 21, the source electrode metal 30, and the drain electrode metal 40. The second additional drain field plate 416 is electrically connected to the drain electrode metal 40 by vias in the device layout. In this embodiment, the second additional drain field plate 416 and the field plate 61 can be deposited at the same time. The second passivation layer 22 and all the passivation layers above the second passivation layer 22 can be made of SiN or SiO$_2$ or a combination of both. The third section 4163 needs to be kept a minimum distance of 0.5 um from the field plate 61. The length relationship in this embodiment is Ldf>Lsf, Ldf1≥Lsf. The simulated drain leakage behavior (Id vs. Vd) showing a comparison between the prior art and the seventh embodiment of the present disclosure is shown in FIG. 12.

It is noted that, the second section 4162 of the second additional drain field plate 416 is not limited with the embodiment for a vertically stepped shape. In fact, similar to the tapered profile embodiment shown in FIG. 7B, the second passivation layer 22 under the first section 4161 and the third section 4163 can be formed with a tapered profile such that the bottom of the second section 4162 is narrower than the top of the second section 4162 to reduce the electric field at the corner of the second passivation layer 22.

Figure 13A:
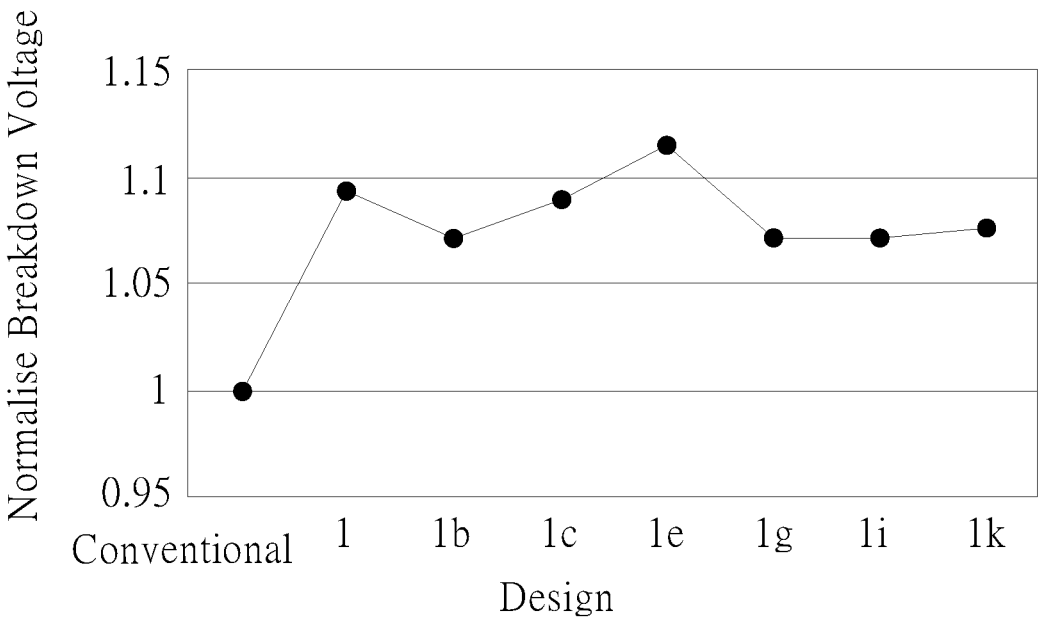
FIG. 13A is a diagram showing a normalized breakdown voltage comparison among the prior art and the first, the second, the third, the fourth, the sixth, the seventh, and the eighth embodiments of the present disclosure.
Figure 13B:
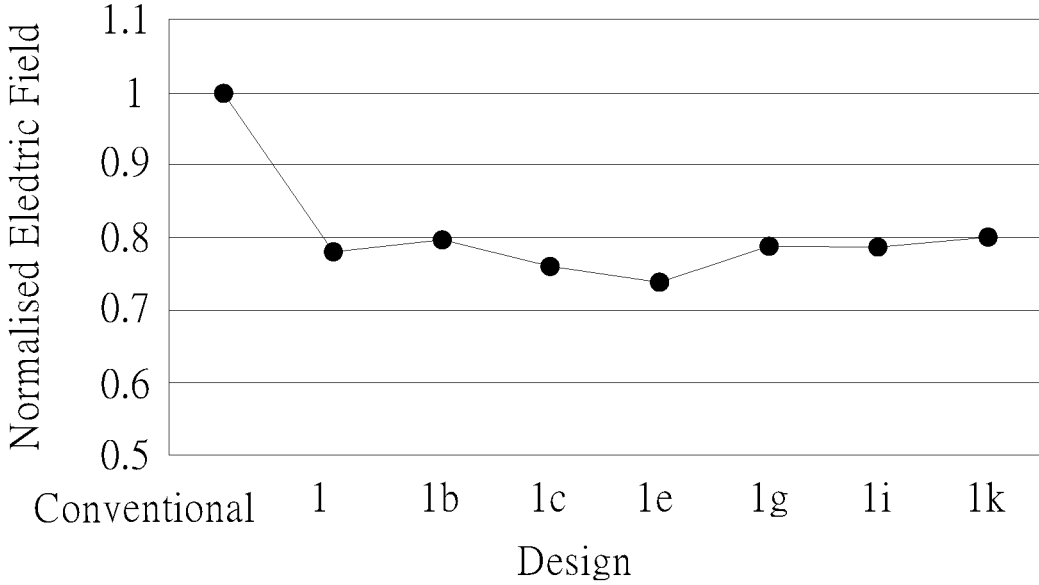
FIG. 13B is a diagram showing a normalized electric field comparison among the prior art and the first, the second, the third, the fourth, the sixth, the seventh, and the eighth embodiments of the present disclosure.

Please refer to FIG. 13A and FIG. 13B, which present diagrams comparing the normalized breakdown voltage among the prior art and the first, the second, the third, the fourth, the fifth, the sixth, and the seventh embodiments of the present disclosure; and a diagram comparing the normalized electric field among the same.

As shown in FIG. 13A, the simulated BV of the conventional design is compared with all the improved field plate designs of the present disclosure. BV is defined as the drain voltage when drain leakage reaches 1 mA. BV is normalised against the conventional design. The length relationship in the conventional design is Lsf=Ldf. Two field plates are used in the simulations for high voltage devices in both the conventional design and the improved field plate design of the present disclosure, and are electrically connected to the source electrode. As shown in FIG. 13B, the simulated electric field at the drain electrode of the conventional design is compared with those of all the improved field plate designs of the present disclosure. The high electron mobility transistor of the prior art and the embodiments of the present disclosure are all biased with 600V at the drain. The electric field is normalised against the conventional design.

It should be noted that many of the above-mentioned embodiments are given as examples for description, and the scope of the present invention should be limited to the scope of the following claims and not limited by the above embodiments.

What is claimed is:

1. A high electron mobility transistor (HEMT) comprising:
a GaN epi-layer;
a first passivation layer deposited on the GaN epi-layer;

a source electrode metal recessed into the first passivation layer and deposited on the GaN epi-layer for forming an Ohmic contact on the GaN epi-layer, the source electrode metal having a source field plate with a source field plate length Lsf;
a drain electrode metal recessed into the first passivation layer and deposited on the GaN epi-layer for forming an Ohmic contact on the GaN epi-layer, the drain electrode metal having a drain field plate with a drain field plate length Ldf, wherein Ldf>Lsf;
a gate electrode recessed into the first passivation layer and deposited on the GaN epi-layer and situated between the source electrode metal and the drain electrode metal;
a field plate situated between the gate electrode and the drain electrode metal; and
a second passivation layer covering the first passivation layer, the source electrode metal, and the drain electrode metal,
wherein the drain field plate is a combination of a first additional drain field plate, a first drain extension section and a second extension section; the first drain extension section and the second extension section are situated on the first passivation layer; and both the field plate and the first additional drain field plate are situated on the second passivation layer such that a portion of the first additional drain field plate is overlapping with the second extension section and is electrically connected to the second extension section by vias in the second passivation layer, and
wherein the first drain extension section and the second extension section are spaced apart, with the first extension section being an extension of the drain electrode metal toward the gate electrode and the second extension section situated between the field plate and the first drain extension section.

2. The high electron mobility transistor as claimed in claim 1, wherein a distance between the field plate and the drain field plate is equal to or larger than 0.5 um.

3. The high electron mobility transistor as claimed in claim 1, wherein the drain field plate is a drain extension of the drain electrode metal extended toward the gate electrode, and the field plate and the drain field plate are deposited on the first passivation layer.

4. The high electron mobility transistor as claimed in claim 3, wherein the drain field plate is divided into a first drain extension section and a second extension section, wherein the first drain extension section and the second extension section are spaced apart, with the second extension section situated between the field plate and the first drain extension section.

5. The high electron mobility transistor as claimed in claim 4, wherein the second drain extension section is electrically connected to the drain electrode metal.

6. The high electron mobility transistor as claimed in claim 3, wherein the drain field plate comprises a first drain extension section and a second extension section, wherein the first passivation layer under the bottom of the first drain extension section is recessed and the first passivation layer under the second drain extension section remains full thickness.

7. The high electron mobility transistor as claimed in claim 6, wherein the first passivation layer under the first drain extension section and the first passivation layer under the second extension section form a stepped shape, either with a vertical step profile or with a tapered profile.

8. The high electron mobility transistor as claimed in claim 1, wherein the second drain extension section is electrically connected to the drain electrode.

9. The high electron mobility transistor as claimed in claim 1, wherein the drain field plate deposited on the first passivation layer and is divided into a first drain extension section, a second extension section, and a third drain extension section, wherein the first passivation layer under the bottom of one of the first, the second or the third drain extension section is recessed while remains full thickness under the other two extension sections; and two opposite sides of the second extension section are connected with the first drain extension section and the third drain extension section respectively.

10. The high electron mobility transistor as claimed in claim 9, wherein the first drain extension section is a drain extension of the drain electrode metal extended toward the gate electrode.

11. The high electron mobility transistor as claimed in claim 9, wherein the first passivation layer is etched to form a stepped shape, either with a vertical step profile or with a tapered profile.

12. A high electron mobility transistor (HEMT), comprising:

a GaN epi-layer;

a first passivation layer deposited on the GaN epi-layer;

a source electrode metal recessed into the first passivation layer and deposited on the GaN epi-layer for forming an Ohmic contact on the GaN epi-layer, the source electrode metal having a source field plate with a source field plate length Lsf;

a drain electrode metal recessed into the first passivation layer and deposited on the GaN epi-layer for forming an Ohmic contact on the GaN epi-layer, the drain electrode metal having a drain field plate with a drain field plate length Ldf, wherein Ldf>Lsf;

a gate electrode recessed into the first passivation layer and deposited on the GaN epi-layer and situated between the source electrode metal and the drain electrode metal;

a field plate situated between the gate electrode and the drain electrode metal; and a second passivation layer and a second additional drain field plate, wherein the drain field plate is deposited on the first passivation layer, the field plate is deposited on the second passivation layer, and a portion of the second additional drain field plate is overlapping with the drain field plate, wherein the second additional drain field plate is divided into a first section, a second section, and a third section, wherein both the first section and the third section are deposited on the second passivation layer, the second passivation layer under the second section is recessed such that the bottom of the second section is deposited on the first passivation layer, and two opposite sides of the second section are connected with the first section and the third section respectively.

13. The high electron mobility transistor as claimed in claim 12, wherein the first passivation layer under the second section and the second passivation layer under the first and the third section form a stepped shape, either with a vertical step profile or with a tapered profile.

14. The high electron mobility transistor as claimed in claim 12, wherein the second passivation layer covers the first passivation layer, the source electrode metal, and the drain electrode metal.

15. The high electron mobility transistor as claimed in claim 12, wherein the second additional drain field plate is electrically connected to the drain electrode metal.

* * * * *